(12) United States Patent
Takahashi (10) Patent No.: US 8,004,008 B2
(45) Date of Patent: Aug. 23, 2011

(54) SEMICONDUCTOR DEVICE (75) Inventor: Kazuya Takahashi, Gunma (JP)

(73) Assignees: SANYO Electric Co., Ltd., Moriguchi-shi (JP); SANYO Semiconductor Co., Ltd., Gunma (JP)

( * ) Notice: Subject to any disclaimer, the term of this patent is extended or adjusted under 35 U.S.C. 154(b) by 0 days.

(21) Appl. No.: 12/547,668

(22) Filed: Aug. 26, 2009

(65) Prior Publication Data

US 2010/0052012 A1 Mar. 4, 2010

(30) Foreign Application Priority Data

Aug. 26, 2008 (JP) ................. 2008-217104
Jul. 15, 2009 (JP) ................. 2009-166992

(51) Int. Cl.
*H01L 29/73* (2006.01)
(52) U.S. Cl. .. 257/164; 257/168; 257/578; 257/E29.174
(58) Field of Classification Search ................... 257/164
See application file for complete search history.

(56) References Cited

U.S. PATENT DOCUMENTS

| 3,448,344 | A | * | 6/1969 | Schuster et al. | ............... 257/446 |
| 2005/0212088 | A1 | * | 9/2005 | Akaki | ............. 257/587 |
| 2008/0265386 | A1 | * | 10/2008 | Muto et al. | ................... 257/676 |
| 2010/0052102 | A1 | | 3/2010 | Takahashi | |

FOREIGN PATENT DOCUMENTS

| JP | 2000-40703 | 2/2000 |
| JP | 2005-285910 | 10/2005 |
| JP | 2005-285911 | 10/2005 |
| JP | 2005-285912 | 10/2005 |

* cited by examiner

*Primary Examiner* — Jarrett Stark
*Assistant Examiner* — Lawrence Tynes, Jr.
(74) *Attorney, Agent, or Firm* — Morrison & Foerster LLP (57) ABSTRACT

The first base electrodes and the first emitter electrodes are all formed like strips, and are alternately arranged in parallel, and the area of the second emitter electrode is expanded to be larger than that of the second base electrode. With this, the number of current paths increases in each of which a current is pulled up almost straight from the emitter region to the second emitter electrode through the first emitter electrodes, thereby preventing the current densities of the entire chip from becoming uneven.

8 Claims, 6 Drawing Sheets

Prior Art

FIG.6B

Prior Art

FIG.6C

Prior Art

SEMICONDUCTOR DEVICE

This application claims priority from Japanese Patent Application Number JP 2008-217104 filed on Aug. 26, 2008, and Japanese Patent Application Number JP 2009-166992 filed on Jul. 15, 2009, the contents of which are incorporated herein by reference in their entirety.

BACKGROUND OF THE INVENTION

1. Field of the Invention

The present invention relates to a semiconductor device, and more specifically to a semiconductor device capable of expanding an area of safe operating, avoiding thermal runaway, and achieving a reduction of resistance components, in a transistor.

2. Description of the Related Art

As a bipolar transistor of a discrete type, known is a bipolar transistor in which base electrodes are arranged in two layers and emitter electrodes are arranged in two layers, on an operating region formed of a lattice-patterned emitter region and an island-shaped base region (this technology is described for instance in Japanese Patent Application Publication No. 2000-40703).

Figure 6A:
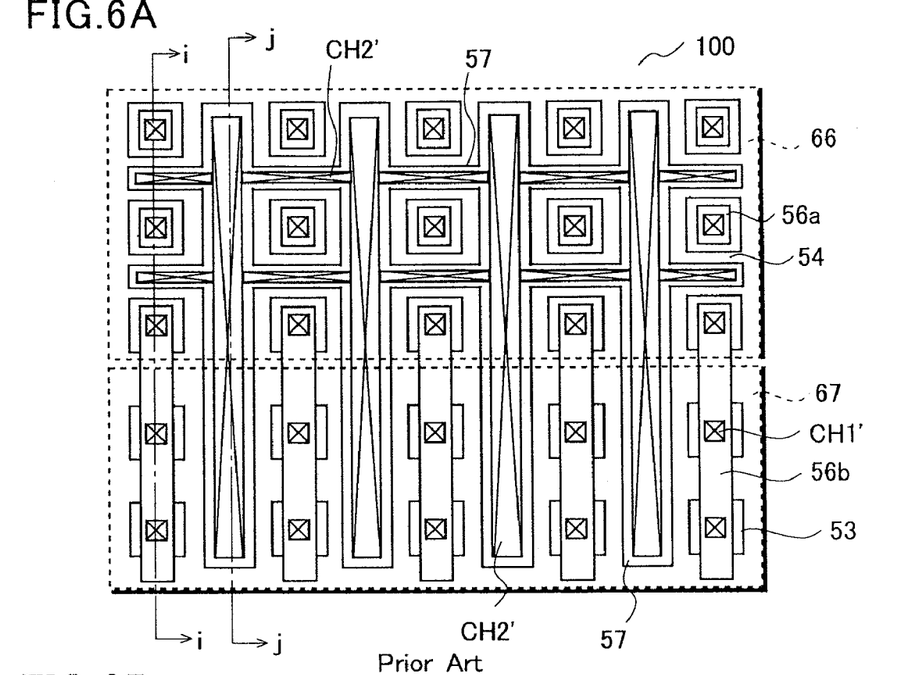
Figure 6B:
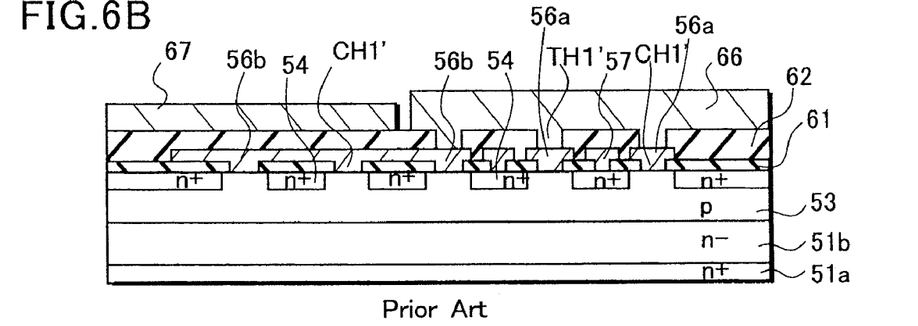
Figure 6C:
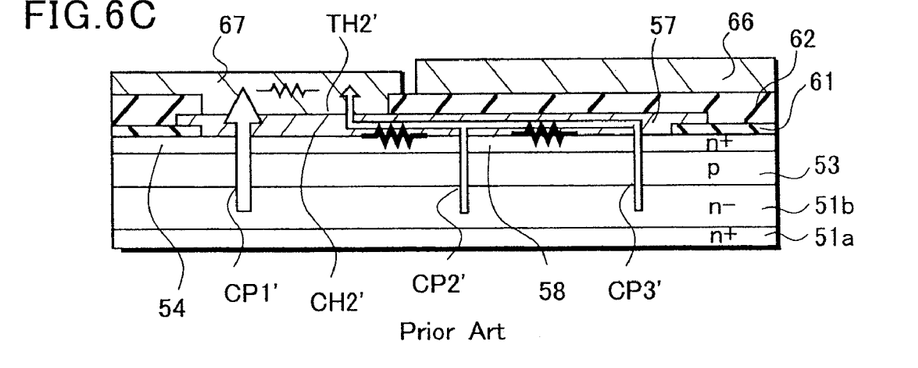
FIG. 6C is a cross sectional view, which as for illustrating a conventional technology.

With reference to FIG. 6, a conventional semiconductor device is described taking an npn type transistor as an example.

FIG. 6A is a plan view of an entire semiconductor device 100. FIG. 6B is a cross-sectional view taken along the line i-i of FIG. 6A. FIG. 6C is a cross-sectional view taken along the line j-j of FIG. 6A. In addition, electrodes of a second layer are shown in dashed lines in FIG. 6A.

On an n+ type silicon semiconductor substrate 51a, a collector region is provided, for example, by stacking an n– type semiconductor layer 51b or by other method. On a surface of the n– type semiconductor layer 51b, a base region 53, which is a p type impurity region, is provided. On a surface of the base region 53, an emitter region 54 is formed by diffusing n+ type impurities in a lattice pattern. Accordingly, the base region 53 is separated into islands, and the resultant islands are arranged alternately with portions of the emitter region 54. Here, the base region has its surface portion separated into islands, and a deep region which is formed below the emitter region 54 is continuous. A transistor including the base region thus divided into islands and the emitter region surrounding the islands is hereinafter referred to as a cell, and a region in which a number of cells are arranged is referred to as an operating region 58.

Base electrodes connected to the base region 53 are formed in a two-layer structure, and emitter electrodes connected to the emitter region 54 are formed in a two-layer structure. Base electrodes on a first layer consist of island-shaped first base electrodes 56a and strip-shaped first base electrodes 56b, and come into contact with the base region 53 through contact holes CH1' provided in a first insulating film 61. The island-shaped first base electrodes 56a and the strip-shaped first base electrodes 56b are respectively arranged in regions halved at an almost center of the operating region 58.

First emitter electrodes 57 are provided in a lattice pattern, and each arranged between the first base electrodes 56a, or between the first base electrodes 56a, 56b. The first emitter electrodes 57 come into contact with the portions of the emitter region 54 through contact holes CH2' provided in the first insulating film 61.

On the first base electrodes 56a, 56b and the first emitter electrodes 57, a second insulating film 62 is provided. On the second insulating film 62, a plate like second base electrode 66 and a second emitter electrode 67, which constitute a second layer, are further provided. The second base electrode 66 comes into contact with the island-shaped first base electrodes 56a and end portions of the strip-shaped first base electrodes 56b through through holes TH1' provided in the second insulating film 62 (see FIG. 6A). The second emitter electrode 67 comes into contact with the first emitter electrodes 57 through through holes TH2' provided in the second insulating film 62 (see FIG. 6B). The plate like second base electrode 66 and the second emitter electrode 67 are equivalent in area, and are each connected with bonding wires (not shown) made of gold (Au) or the like.

SUMMARY OF THE INVENTION

With reference to FIG. 6C, under the second base electrode 66, collector currents flow to the second emitter electrode through each of the first emitter electrodes 57 underneath the second base electrode 66. Here, the thickness of the electrode of the first layer (first emitter electrode 57) is thinner than the thickness of the electrode of the second layer (second emitter electrode 67). This causes a problem that each of current paths CP2', CP3' having a long distance to the second emitter electrode 67 has a greater resistance than a current path CP1' does, which is located directly underneath the second emitter electrode 67.

Thus, a problem arises that collector currents are likely to concentrate on the current path CP1', thereby making current densities of a chip uneven. The uneven current densities increase a risk of thermal runaway, which will cause a problem of narrowing an area of safe operating (herein after referred to as ASO). In addition, another problem arises that generation of cells which do not operate when power is ON further increases resistance components, thus increasing unevenness of the current densities.

The invention provides a semiconductor device that includes a semiconductor substrate of a first general conductivity type configured to operate as a collector region, a base region of a second general conductivity type formed on the substrate, an emitter region of the first general conductivity type formed in a surface portion of the base region so as to define a plurality of isolated portions of the base region in the surface portion in plan view of the semiconductor device, a first insulating film disposed on the emitter region and the isolated portions of the base region, a plurality of first base electrodes each disposed on and in contact with corresponding isolated portions of the base region, a plurality of first emitter electrodes each disposed on and in contact with the emitter region, a second insulating film disposed on the first base electrodes and the first emitter electrodes, a second base electrode disposed on the second insulating film so as to overlay portions of the first base electrodes and portions of the first emitter electrodes and so as to be electrically in contact with the first base electrodes, a second emitter electrode disposed on the second insulating film so as to overlay portions of the first base electrodes and portions of the first emitter electrodes and so as to be electrically in contact with the first emitter electrodes. The second base electrode is smaller in area than the second emitter electrode.

BRIEF DESCRIPTION OF THE DRAWINGS

FIG. 1A is a plan view, FIG. 1B is a cross sectional view.

FIG. 2A is a plan view, FIG. 2B is a cross sectional view.

FIG. 3A is a plan view, FIG. 3B is a cross sectional view.

FIG. 5A is a plan view, FIG. 5B is a cross sectional view.

FIG. 6A is a plan view, FIG. 6B is a cross sectional view.

DESCRIPTION OF THE INVENTION

Embodiments of the present invention will be described with reference to FIGS. 1 to 5. In the present embodiments, descriptions will be given by exemplifying an npn type bipolar transistor of a discrete device as a semiconductor device 10.

Figure 1A:
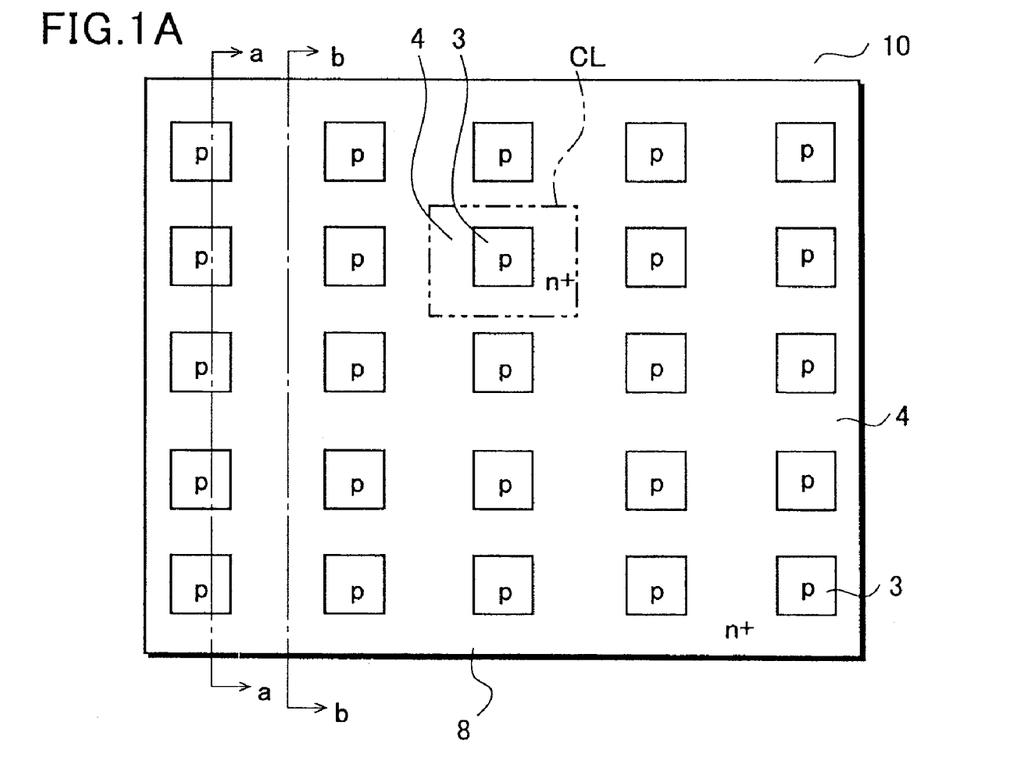
Figure 1B:
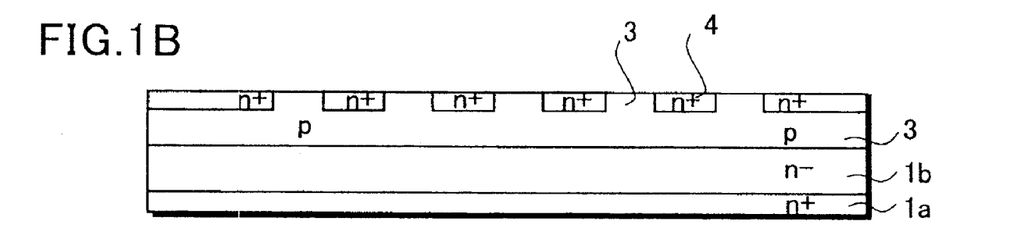
Figure 1C:
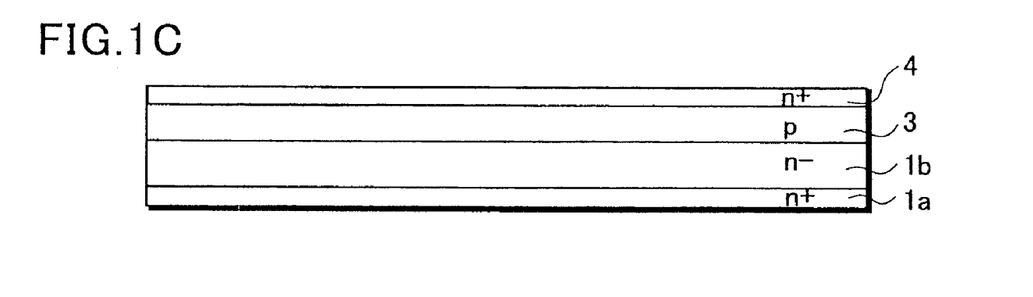
FIG. 1C is a cross sectional view, which are for illustrating embodiments of the present invention.

FIGS. 1A to 1C are views showing a structure of the semiconductor device 10, which is a first embodiment. FIGS. 1A to 1C show an operating region. FIG. 1A is a plan view. FIG. 1B is a cross sectional view taken along the line a-a of FIG. 1A. FIG. 1C is a cross sectional view taken along the line b-b of FIG. 1A.

A semiconductor substrate 1 is formed with an n+ type semiconductor substrate 1a of high concentration having an n− type semiconductor layer 1b provided thereon by epitaxial growth, for example. The semiconductor substrate 1 serves as a collector region of a bipolar transistor.

A base region 3 is a p-type diffusion region provided on a surface of the collector region. On a surface of the base region 3, an emitter region 4 is formed by diffusing n+ type impurities in a lattice pattern. With this, the base region 3 is separated into islands which are shown in squares in FIG. 1A. Here, the base region has its surface portion separated into islands, and a deep region which is formed below the emitter region 4 is continuous (FIG. 1C). A number of cells CLs, each being formed of the islands, separated from the base region 3, and the emitter region 4 surrounding them, are arranged and constitute the operating region 8.

It is noted that conductivity types such as n+, n and n− belong in one general conductivity type and conductivity types such as p+, p and p− belong in the other general conductivity type.

Here, one cell CL is a region formed of one island of the base region 3 and the emitter region 4 which is in contact with the island of the base region and surrounds an outer circumference of the island of the base region. Specifically, one cell CL is formed of one of island of the base region 3 and one of pieces of the emitter region 4, the piece being in contact with and surrounding the island of the base region 3. The pieces are obtained by dividing the emitter region 4 so as to halve strips of the lattice at each center, the emitter region 4 arranged in a lattice pattern sandwiched by the island of the base region 3 (See the dashed-two dotted line of FIG. 1A). As shown in FIG. 1A, the end of the emitter region 4 and the end of the base region 3 are the end of the operating region 8.

In the present embodiment, the islands of the base region 3 have an equal shape and an equal area, and they are arranged in a matrix form on the semiconductor substrate (a chip). In the present embodiment, the emitter region 4 is in a lattice pattern to ensure the area as large as possible.

Figure 2A:
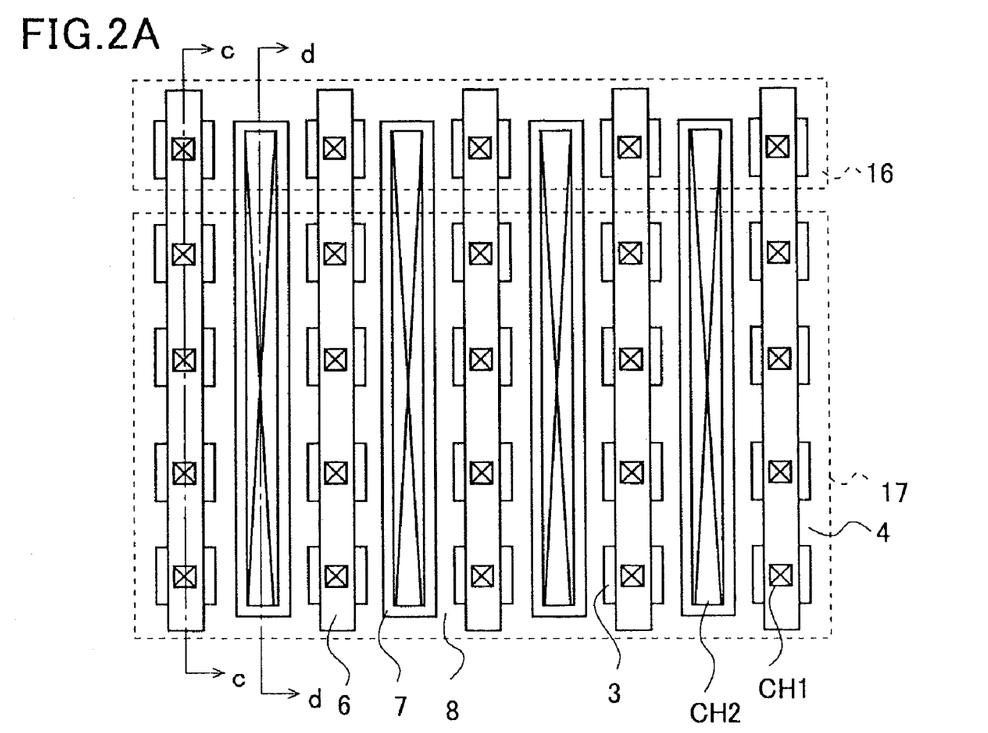
Figure 2B:
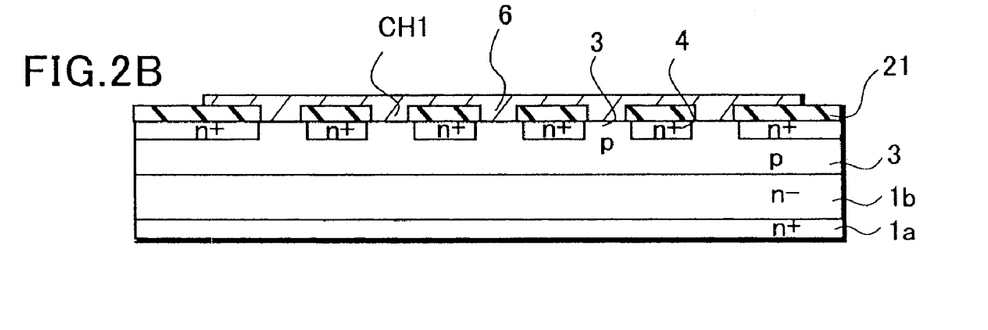
Figure 2C:
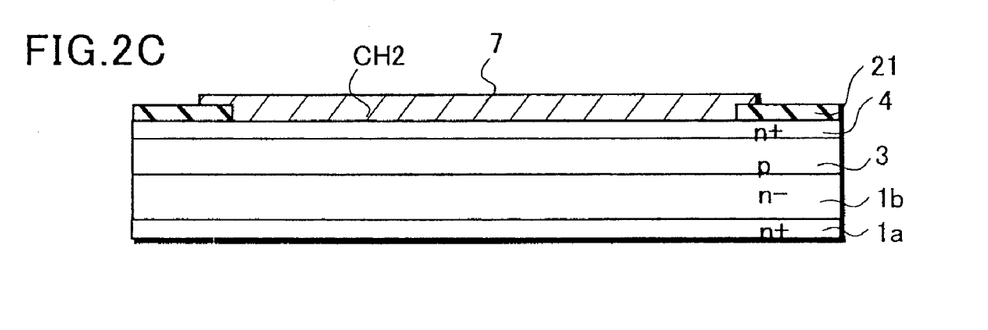
FIG. 2C is a cross sectional view, which as for illustrating the present embodiments of the present invention.

FIGS. 2A to 2C are views showing a structure of an electrode of a first layer and the operating region. FIG. 2A is a plan view. FIG. 2B is a cross sectional view taken along the line c-c of FIG. 2A. FIG. 2C is a cross sectional view taken along the line d-d of FIG. 2A. In addition, in FIG. 2A, an electrode of a second layer is shown in dashed line.

As shown in FIG. 2A, on a surface of the operating region 8 (the base region 3 and the emitter region 4), a first insulating film (not shown here) is provided, and on the first insulating film first base electrodes 6 and first emitter electrodes 7 are provided.

The first base electrodes 6 are formed in strip shapes and connect to multiple islands of base region 3. Each of the first base electrodes 6 extends over a column or a row (a row herein) of the islands of the base region 3 (and the portions of the emitter region 4 among them), the islands of the base region 3 arranged in a direction parallel to one side of the semiconductor substrate (the chip). The first base electrode 6 comes into contact with all the islands of the base region 3 arranged in a direction in which the base electrode extends.

First emitter electrodes 7 are also formed in strip shapes, and connect with the emitter region 4. Although the emitter region 4 is in a lattice pattern (FIG. 1A), the first emitter electrodes 7 extend only in one direction parallel to one side of the semiconductor substrate. More specifically, the first emitter electrodes 7 are parallel to the first base electrodes 6 and arranged alternately with the first base electrodes 6.

With reference to FIGS. 2B and 2C, a first insulating film 21 has multiple base contact holes CH1 corresponding to the islands of the base region 3 and strip-shaped emitter contact holes CH2 corresponding to the portions of the emitter region 4 provided therein. The multiple rectangular base contact holes CH1 are provided below each one of the first base electrodes 6. The base contact holes CH1 are overlapped with the islands of the base region 3 and spaced from each other. Through the base contact holes CH1, the single first base electrode 6 comes into contact with the multiple islands of the base region 3 (FIG. 2B).

The strip-shaped emitter contact holes CH2 are provided below the first emitter electrodes 7. Each one of the emitter contact holes CH2 is overlapped with the corresponding one of the first emitter electrodes 7, and the emitter electrode 7 comes into contact with the emitter region 4 through the emitter contact hole CH2. Each one of the emitter contact holes CH2 is provided so as to extend in a direction in which the corresponding one of the first emitter electrodes 7 extends (FIG. 2C).

Figure 3A:
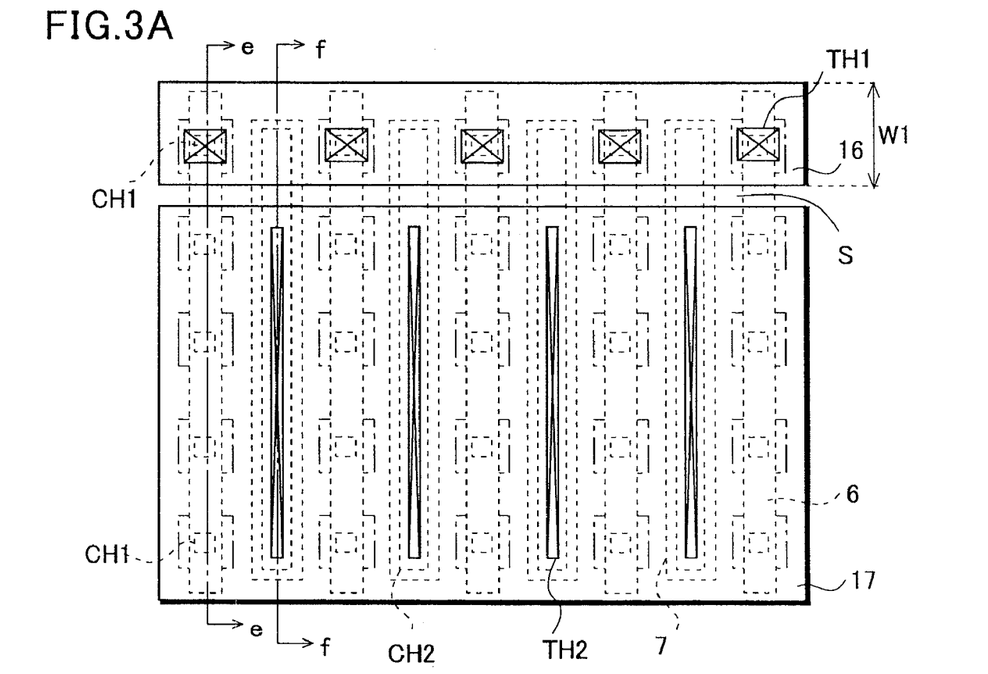
Figure 3B:
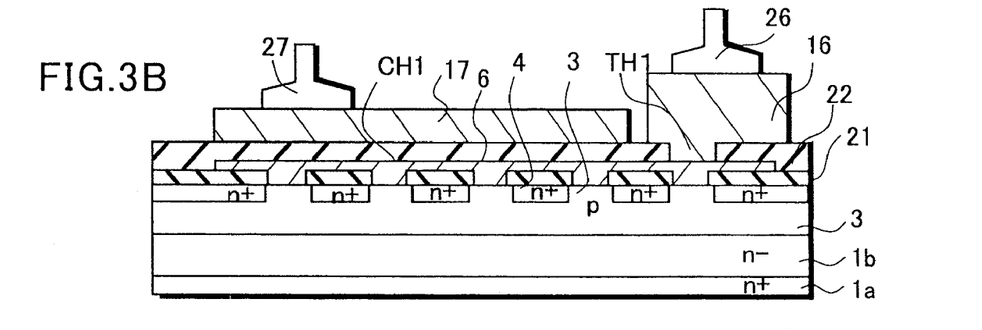
Figure 3C:
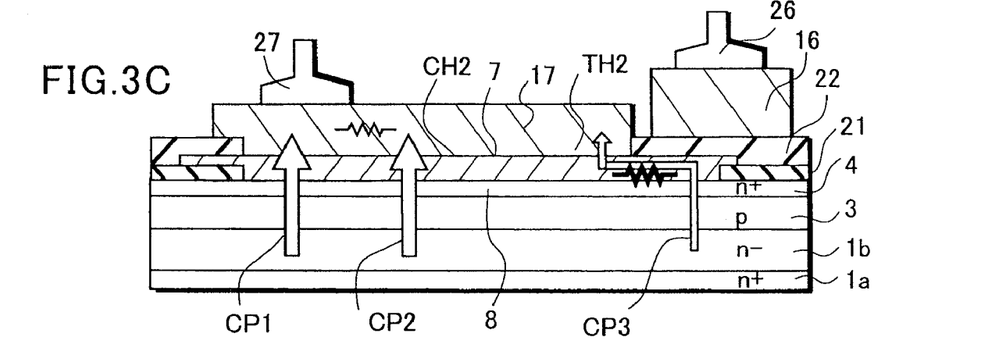
FIG. 3C is a cross sectional view, which as for illustrating a first embodiment of the present invention.

FIGS. 3A to 3C show a structure of the electrode of the second layer. FIG. 3A is a plan view. FIG. 3B is a cross sectional view taken along the line e-e of FIG. 3A. FIG. 3C is a cross sectional view taken along the line f-f of FIG. 3A. In addition, the first base electrode 6 and the first emitter electrode 7 of the first layer are shown in dashed line in FIG. 3A.

With reference to FIG. 3A, a second insulating film (not shown here) is provided to cover the first base electrodes 6 and the first emitter electrodes 7, and one plate like second base electrode 16 and one plate like second emitter electrode 17 are provided on the second insulating film.

The second base electrode 16 connects to the multiple portions of the first base electrode region 6. More specifically, the second base electrode 16 covers ends of all the first base electrodes 6 and ends of all the first emitter electrodes 7 which extend in a column direction here and are arranged on the semiconductor substrate (the chip), and comes into contact with the ends of all the first base electrodes 6.

The second emitter electrode 17 is provided adjacent to the second base electrode 16 and comes into contact with the first emitter electrodes 7. More specifically, the second emitter electrode 17 covers all of the first base electrodes 6 and the first emitter electrodes 7 arranged on the semiconductor substrate (the chip), and comes into contact with all the first emitter electrodes 7.

A boundary portion S between the second base electrode 16 and the second emitter electrode 17 is spaced apart from each other by a desired distance of approximately 30 μm. The boundary portion S extends in a direction orthogonal to the direction in which the first base electrodes 6 and the first emitter electrodes 7 extend.

With reference to FIGS. 3B and 3C, the second insulating film 22 has a rectangular base through hole TH1 and an strip-shaped emitter through hole TH2 provided therein.

A portion of the second insulating film 22 below the second base electrode 16 has only the base through holes TH1 provided therein. In detail, each of the rectangular base through hole TH1 is provided so as to correspond to the first base electrode 6 in each row. Through the base through holes, the multiple first base electrodes 6 have their ends come into contact with a single plate like second base electrode 16. More specifically, as shown in FIG. 3B, a portion of the base region 3 underneath the second base electrode 16 directly connects to the first base electrode 6, which is arranged immediately above the base region 3, and the second base electrode 16, through the base contact hole CH1 and the base through hole TH1 which are overlapped with the base region 3.

A portion of the second insulating film 22 below the first emitter electrodes 7 has only emitter through holes TH2 provided therein. In detail, the strip-shaped emitter through holes TH2 are provided so as to correspond to and so as to be superposed on the first emitter electrodes 7 in rows. The multiple first emitter electrodes 7 come into contact with one plate like second emitter electrode 17 through the emitter through holes. More specifically, as shown in FIG. 3C, the emitter through holes TH2 provided in the second insulating film 22 below the second emitter electrodes 17 are superposed on the emitter contact holes CH2 below the second emitter electrodes, respectively. Thus, portions of the emitter region 4 below the first emitter electrodes 7 directly come into contact with the first emitter electrodes 7 arranged immediately above the portions of the emitter region 4, and the second emitter electrode 17 through the emitter contact hole CH2 and the emitter through hole TH2. An external connection such as bonding wires 26, 27 or the like is bonded onto the second base electrode 16 and the second emitter electrode 17 (FIGS. 3B and 3C).

The second base electrode 16 has the area which is equal to or below one-third of the area of the second emitter electrode 17. It is preferable that the second base electrode 16 have a minimum area to ensure the area (width W1 of 100 μm to 150 μm, for example (See FIG. 3A)) required at least for wire bonding of the bonding wire 26 to one or two locations on a surface of the second base electrode 16. This can expand the area of the second emitter electrode 17 more than conventional.

Conventionally, the first emitter electrode has had at least a part shaped in a lattice pattern. However, in the present embodiment, all the first emitter electrodes 7 are formed in strips, thereby expanding the area of the second emitter electrode 17 to the maximum extent.

With reference to FIG. 3C, as the area of the second emitter 17 is expanded, collector currents, such as the current paths CP1, CP2, in the operating region 8 below the second emitter 17 can be pulled up almost straight, and thus resistance of the current paths can be lowered. The area of the operating region 8 located below the second base electrode 16 can be reduced, leading to a reduction of current paths having a high resistance, such as the current path CP3, in which a current flows from the operating region 8 to the thin first emitter electrode 7 in the direction in which the first emitter electrode 7 extends and is then pulled up to the second emitter electrode 17.

This eliminates unevenness of current densities of an entire chip, reduces risks of thermal runaway, and can expand the ASO. Furthermore, since generation of cells which do not operate can be reduced, further increase in resistance components due to existence of non-operating cells can be avoided.

Figure 4A:
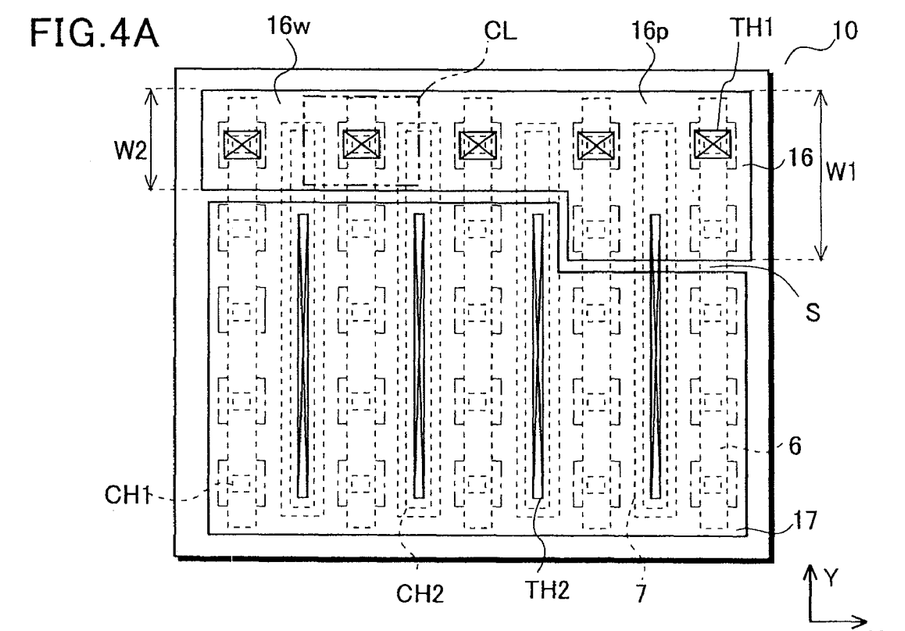
FIGS. 4A and 4B are plan views for illustrating a second embodiment of the present invention.
Figure 4B:
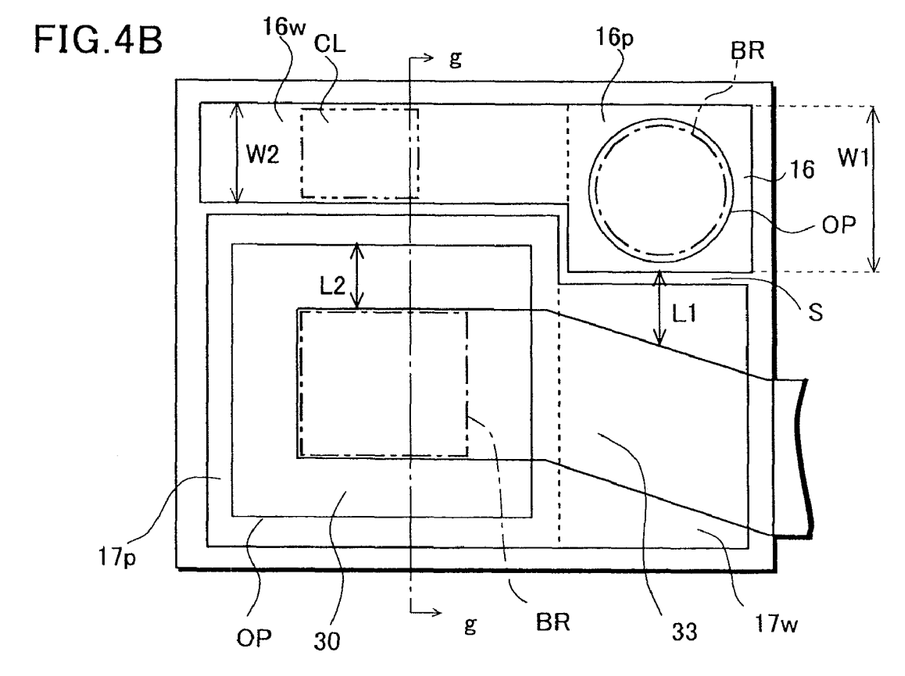

With reference to FIGS. 4A and 4B and FIGS. 5A to 5C, a description will be given of an example of a second embodiment of the semiconductor device 10 described above. FIGS. 4A and 4B are plan views showing a second base electrode 16 and a second emitter electrode 17 of the semiconductor device 10. FIG. 4A is a plan view showing both electrode layers and a part of configuration of the lower layers. FIG. 4B is a plan view illustrating the second base electrode 16, the second emitter electrode 17, and an external connection connected thereto.

In the second embodiment, the second base electrode 16 and the second emitter electrode 17 are respectively patterned either into a concavo or convex shape, and are arranged so that concave portion engage with convex portion. A configuration here is similar to that of the first embodiment except for the pattern of the second base electrode 16, the pattern of the second emitter electrode 17, and the external connection connected to the second emitter electrode 17.

The second base electrode 16 includes a base pad portion 16p having a first width W1 and a base wiring portion 16w having a second width W2 which is smaller than the first width W1. Here, both the first width W1 and the second width W2 are a width extending in a direction in which the first base electrode 6 (the first emitter electrode 7) extends.

With reference to FIG. 4B, one end of a bonding wire (not shown) is bonded to a bonding region BR shown in dashed-dotted line of the base pad portion 16p. In other words, for the first width W1, a width necessary for wire bonding (100 μm to 150 μm, for example) is ensured, and the base pad portion 16p has a minimum area which ensures the area necessary for wire bonding (the area of a square of 100 μm×100 μm, for example).

A second width W2 of the base wiring portion 16w is a minimum width (80 μm to 100 μm, for example) which ensures a region of one cell CL (see the dashed-two dotted line of FIGS. 4A and 4B).

The second emitter electrode 17 has an emitter wiring portion 17w facing the base pad portion 16p with a boundary portion S in between, and an emitter pad portion 17p facing the base wiring portion 16w with the boundary portion S in between. The emitter pad portion 17p is shaped like a rectangular having the area larger than that of the emitter wiring portion 17w.

The second base electrode 16 and the second emitter electrode 17 are coated with an insulating film (not shown here), such as a nitride film, for example. Openings OP are provided in the insulating film. The opening in the second base electrode 16 (base pad portion 16p) serves as a bonding region BR to be bonded with a bonding wire, and the opening in the second emitter electrode 17 (emitter pad portion 17p) becomes a bonding region BR to be bonded with a metal plate 33 (FIG. 4(B)).

A conductive adhesive material (solder or silver (Ag) paste or the like, for example) 30 is applied on a surface of the emitter pad portion 17p to which one end of the metal plate 33 made of copper (Cu), for example, is bonded. The one end of the metal plate 33 is bonded to an almost center of the emitter pad portion 17p. The region in the emitter pad portion 17p shown by the dashed-dotted line of FIG. 4B is the bonding region BR.

In the second embodiment, the boundary portion S extends in a first direction and bends to and extends in a second direction orthogonal to the first direction. A distance of the boundary portion extending in the first direction is longer than a distance thereof in the second direction. The first direction is a direction X of FIG. 4A and the second direction is a direction Y of FIG. 4A.

The base pad portion 16p in the present embodiment is provided on a corner portion of a chip. This allows the emitter pad portion 17p and the base pad portion 16p to be arranged in a way that they are not facing each other in a direction in which the first base electrode 6 (first emitter electrode 7) extends (the direction Y of FIG. 4A), and can ensure a large distance L2 between the opening OP and the bonding region BR.

In addition, a distance L1 spaced between the base pad portion 16p and the metal plate 33 on the emitter pad portion 17p can be increased as much as possible.

Figure 5A:
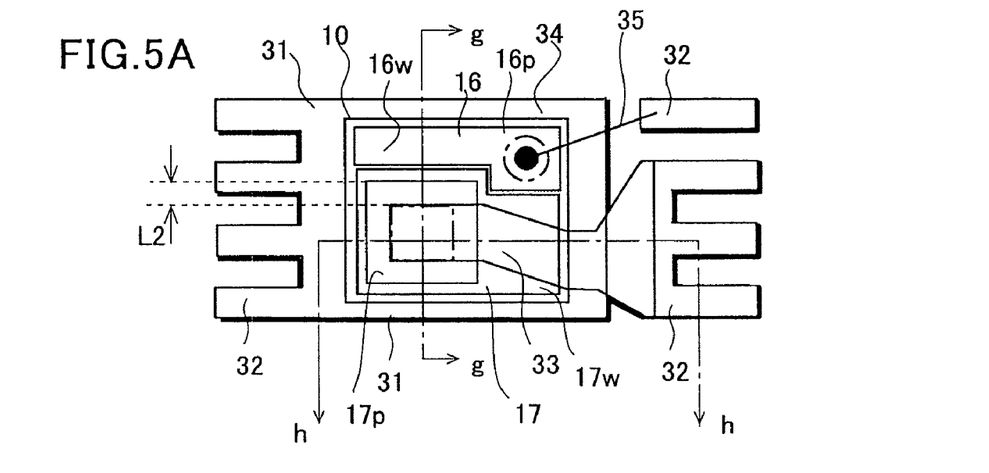
Figure 5B:
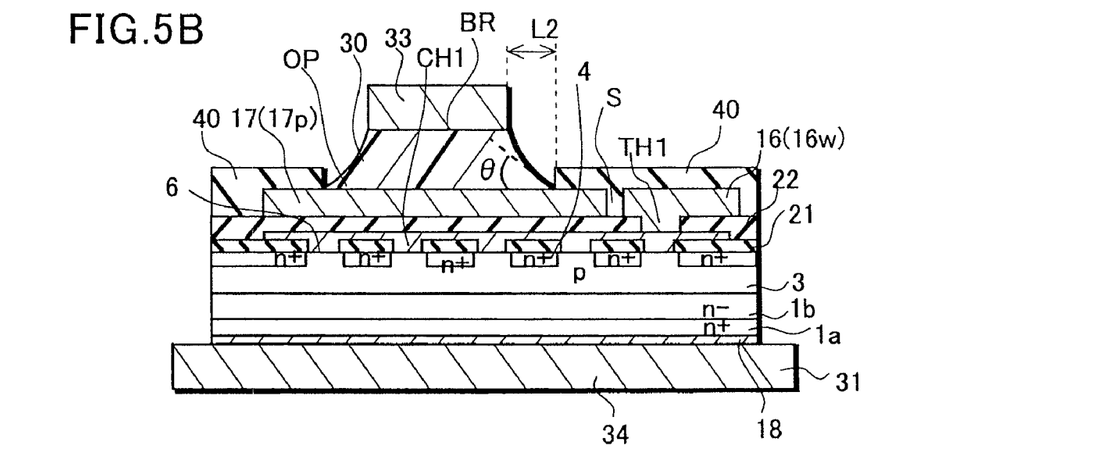
Figure 5C:
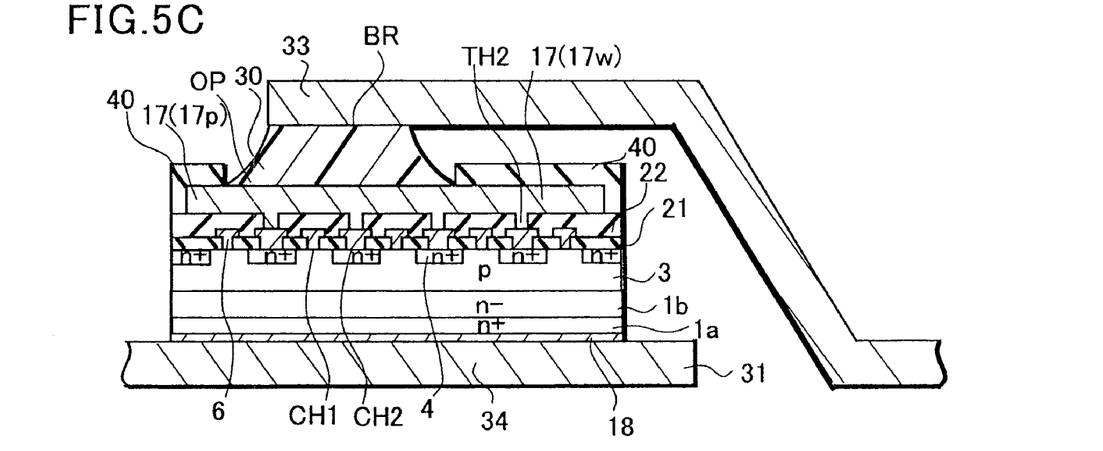
FIG. 5C is a cross sectional view, which as for illustrating the second embodiment of the present invention.

With reference to FIGS. 5A to 5C, further description will be given. FIGS. 5A to 5C are views showing a mounting of the semiconductor device 10 of the second embodiment. FIG. 5A is a plan view. FIG. 5B is a cross sectional view taken along the line g-g of FIGS. 5A and 4B, showing a bonding region BR of the metal plate 33. FIG. 5C is a cross sectional view taken along the line h-h of FIG. 5A.

The semiconductor device 10 having a collector electrode 18 formed on a backside thereof is bonded to a header 34 of a copper stamped frame 31, for example.

One end of a bonding wire 35 is bonded to the base pad portion 16p, and the other end thereof is bonded to a lead 32 of the frame 31 (FIG. 5A).

One end of the metal plate 33 is bonded to the emitter pad portion 17p, and the other end thereof is bonded to the lead 32 of the frame 31. Otherwise, the other end of the metal plate 33 may, as it is, form a part of the lead 32 (FIGS. 5A and 5C).

Incidentally, as shown in FIG. 5B, when the metal plate 33 is bonded by supplying solder (or Ag paste) 30 to the opening OP of the insulating film (nitride film) 40 covering the second emitter electrode 17 (emitter pad portion 17p), it is desirable to make an angle $\theta$ small, the angle $\theta$ made by a surface of the second emitter electrode 17 and a surface of the solder (or Ag paste). For example, it is preferred that the angle $\theta$ is equal to or less than 60°. If the angle $\theta$ is large (angle nearly 90°, for example), a defect may occur that the second emitter electrode 17 cracks. In addition, if the crack of the second emitter electrode 17 affects the second insulating film 22 which is the lower layer thereof so that the second insulating film 22 cracks, a problem occurs that the second emitter electrode 17 and the first base electrode 6 are shorted.

Thus, in order to make the angle $\theta$ as small as possible, at least the predetermined distance L2 should be ensured from the end of the opening OP of the insulating film 40 to the end of the metal plate 33. Specifically, the angle $\theta$ can be made equal to or less than 60° by ensuring the distance L2 of 110 μm or longer, for example.

However, if, for example, the base pad portion 16p is provided in a center portion of one chip side, and the base pad portion 16p is arranged so as to be facing the emitter pad portion 17p with the boundary portion S in between in the direction Y of FIG. 4A, the opening OP of the emitter pad portion 17p should be reduced to ensure the first width W1 of the base pad portion 16p. With this, the distance L2 from the end of the opening OP to the end of the metal plate 33 becomes small (less than 110 μm, for example), and the angle $\theta$ made by the surface of the second emitter electrode 17 and the surface of the solder becomes large (larger than 60°), which thus lead to deterioration of the second emitter electrode 17.

In order to avoid this, it is preferable that the base pad portion 16p and the emitter pad portion 17p may be arranged so as not to face each other in the direction Y of FIG. 4A. This ensures the distance L2 of at least 110 μm.

In addition, when wiring is bonded to the base pad portion 16p, it is preferable that the distance L1 between the metal plate 33 and the base pad 16p is increased as much as possible in order to avoid any mechanical interference between a bonding wire and the metal plate 33. Thus, in the present embodiment, the base pad portion 16p is arranged on the corner portion of the chip.

Vertically arranged cells CL have almost the same number as that of horizontally arranged cells CL. In the example of FIG. 4, for example, there are 5 columns×5 rows. As a result, the operating region 8 is shaped almost like a square when seen from its top.

Arranging the base pad portion 16p at any of four corners of the operating region 8 in this manner makes it possible to ensure an almost-square-shaped region having a maximum area among the unused regions, as an opening OP of the insulating film 40 on the emitter pad portion 17p.

Consequently, the distance L2 from the bonding region BR to the end of the opening OP can be made large. With this, a value of the angle $\theta$ can be made small so as to ensure reliability of the device.

Although the description was given above taking the npn type bipolar transistor as an example in the present embodiment, the present embodiment can be similarly implemented and similar effects can be achieved, even with a pnp type bipolar transistor which has an opposite conductivity type.

According to the present invention, the following effects can be achieved.

First, the total area of first emitter electrodes arranged immediately under a second emitter electrode can be increased by making the area of a plate like second emitter electrode larger than the area of a second base electrode. This can expand a region where current paths have a low resistance value, thereby preventing concentration of currents. Accordingly, current densities of a chip can be made even, and a risk of thermal runaway or narrowing of ASO can be prevented. In addition, since the current densities are distributed, cells which do not operate when the power is ON can be reduced. Consequently, concentration of currents and an increase in resistance components due to existence of non-operating cells can be avoided.

Secondly, when ASO and resistance values are implemented to be equivalent to a conventional case, a chip can be downsized.

What is claimed is:

1. A semiconductor device comprising:
   a semiconductor substrate of a first general conductivity type configured to operate as a collector region;
   a base region of a second general conductivity type formed on the substrate;
   an emitter region of the first general conductivity type formed in a surface portion of the base region so as to define a plurality of isolated portions of the base region in the surface portion in plan view of the semiconductor device, the isolated portions being arranged in a matrix form comprising rows extending in a first direction and columns extending in a second direction;
   a first insulating film disposed on the emitter region and the isolated portions of the base region;

a plurality of first base electrodes each disposed on and in contact with corresponding isolated portions of the base region;

a plurality of first emitter electrodes each disposed on and in contact with the emitter region;

a second insulating film disposed on the first base electrodes and the first emitter electrodes;

a second base electrode disposed on the second insulating film so as to overlay portions of the first base electrodes and portions of the first emitter electrodes and so as to be electrically in contact with the first base electrodes;

a second emitter electrode disposed on the second insulating film so as to overlay portions of the first base electrodes and portions of the first emitter electrodes and so as to be electrically in contact with the first emitter electrodes, the second base electrode being smaller in area than the second emitter electrode, wherein all of the first base electrodes are elongated in the first direction of the matrix so that each first base electrode is disposed in a corresponding row of the matrix and is in contact with isolated portions of the corresponding row.

2. The semiconductor device of claim 1, wherein the first emitter electrodes are elongated in the first direction.

3. The semiconductor device of claim 1, wherein an area of the second base electrode is equal to or smaller than one third of an area of the second emitter electrode.

4. The semiconductor device of claim 1, wherein a boundary between the second base electrode and the second emitter electrode extends in a direction perpendicular to the first direction in the plan view of the semiconductor device.

5. The semiconductor device of claim 1, wherein the emitter region forms a lattice pattern to define the isolated portions of the base region as the matrix.

6. The semiconductor device of claim 1, wherein the second base electrode comprises a base pad portion having a first width and a base wiring portion having a second width which is smaller than the first width, the first width is sufficient for wire bonding, and the second width is equal to or larger than a width of one cell formed of one of the isolated portions of the base region and the emitter region surrounding said one of the isolated portions.

7. The semiconductor device of claim 6, wherein the second emitter electrode comprises an emitter wiring portion facing the base pad portion and an emitter pad portion facing the base wiring portion, and the emitter pad portion is larger than the emitter wiring portion.

8. The semiconductor device according to claim 7, further comprising a conductive adhesive material disposed on the emitter pad portion, and a metal plate bonded to substantially a center of the emitter pad portion with the conductive adhesive material.

* * * * *